United States Patent
Schmitt et al.

[19]

[11] Patent Number: 6,049,451
[45] Date of Patent: Apr. 11, 2000

[54] MOUNTING RAIL RETAINING PIN APERTURE

[75] Inventors: Ty R. Schmitt, Round Rock; Arthur Lopez; Steven L. Sands, both of Austin, all of Tex.

[73] Assignee: Dell USA, L.P., Round Rock, Tex.

[21] Appl. No.: 08/963,788

[22] Filed: Nov. 4, 1997

Related U.S. Application Data

[63] Continuation-in-part of application No. 08/748,850, Nov. 14, 1996, Pat. No. 5,691,879.

[51] Int. Cl.[7] ................................. G06F 1/16; H05K 5/00
[52] U.S. Cl. ....................... 361/685; 312/219; 312/216; 312/223.2; 70/163
[58] Field of Search .................... 361/683–685; 312/219, 216, 217, 223.2; 364/708.1; 70/82, 86, 163, 63

[56] References Cited

U.S. PATENT DOCUMENTS

| | | | |
|---|---|---|---|
| 3,866,993 | 2/1975 | Dean et al. | 312/216 |
| 4,303,287 | 12/1981 | Taplin | 312/215 |
| 4,662,776 | 5/1987 | Hedstrom et al. | 403/387 |
| 4,685,312 | 8/1987 | Lakoski et al. | 70/14 |
| 5,019,932 | 5/1991 | Iwata | 360/105 |
| 5,077,722 | 12/1991 | Geist et al. | 369/75.1 |
| 5,212,681 | 5/1993 | Bock et al. | 369/244 |
| 5,216,662 | 6/1993 | Stefansky et al. | 369/215 |
| 5,229,919 | 7/1993 | Chen | 361/391 |
| 5,277,615 | 1/1994 | Hastings et al. | 439/377 |
| 5,325,263 | 6/1994 | Singer et al. | 361/683 |
| 5,451,168 | 9/1995 | Shuey | 439/159 |
| 5,579,204 | 11/1996 | Nelson et al. | 361/685 |
| 5,586,003 | 12/1996 | Schmitt et al. | 361/683 |
| 5,588,728 | 12/1996 | Eldridge et al. | 312/332.1 |
| 5,652,695 | 7/1997 | Schmitt | 361/685 |
| 5,668,696 | 9/1997 | Schmitt | 361/685 |

*Primary Examiner*—Leo P. Picard
*Assistant Examiner*—Lisa Lea Edmonds
*Attorney, Agent, or Firm*—Skjerven, Morrill, MacPherson, Franklin & Friel, L.L.P.

[57] ABSTRACT

An aperture in a mounting rail for receiving a retaining pin for securing or locking a carrier that is slid into a carrier bay on the mounting rail. The carrier holds a computer system hard disk drive. The retaining pin extends through the mounting rail aperture and engages a surface on the carrier when the carrier is in a secured position to secure or lock the carrier in the carrier bay. In one example, the mounting rail aperture is located on top of the mounting rail and is formed by an aperture frame that is supported by stiffening ribs. The retaining pin is moved to a secured or locking position by a key actuated cam. The key actuated cam moves a locking bar attached to the retaining pin.

23 Claims, 10 Drawing Sheets

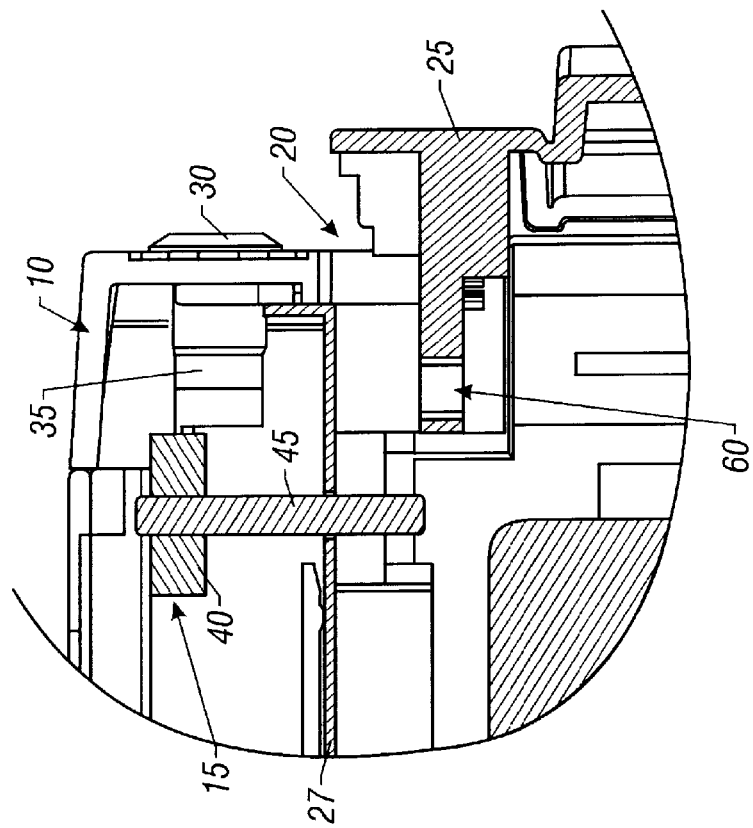
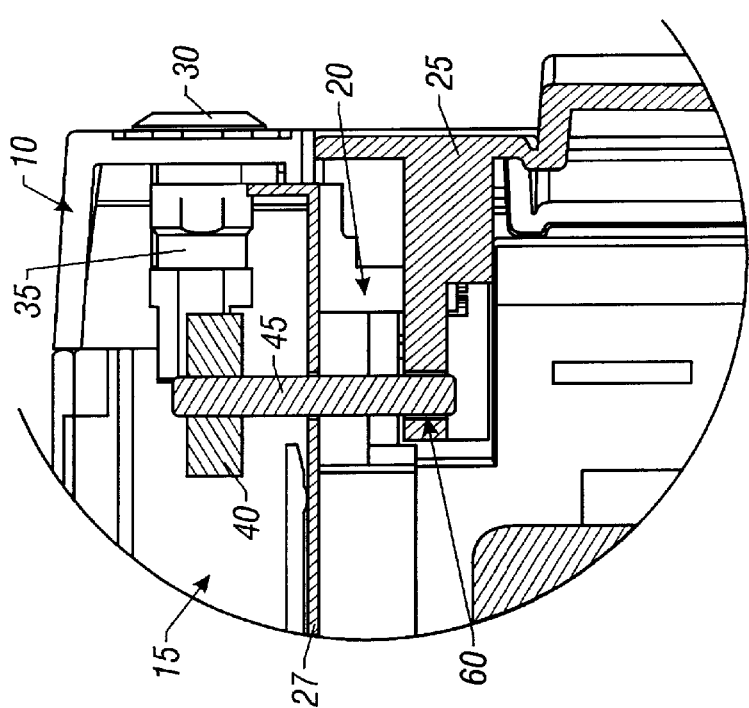

MOUNTING RAIL RETAINING PIN APERTURE

RELATED CASES

This is a continuation-in-part of U.S. application Ser. No. 08/748,850 filed Nov. 14, 1996, now U.S. Pat. No. 5,691,879 entitled, "Locking Apparatus for Disk Drive Carriers", which is hereby incorporated by reference in its entirety.

BACKGROUND OF THE INVENTION

1. Field of the Invention

This invention relates to locking devices for data storage systems in computers and, in particular, locking a disk drive carrier or cartridge into a data storage system frame including a mounting rail with a retaining pin aperture.

2. Description of the Related Art

It is a problem in hard disk drive housing and mounting arrangements in computer systems or subsystems, such as hard disk drive array units, to provide a mechanically simple and cost effective device that enables reliable locking of a plurality of disk drive carriers or cartridges for transportation packaging and security of data stored. Another important design consideration for locking devices is small size especially if the locking device is to be internal to the disk drive housing.

There are numerous types of apparatus and methods for locking disk drive cartridges or carriers within a cabinet or housing for packaging and security. One method is to simply install key locks on each individual hard disk drive carrier assembly. However, this burdens each carrier with the added cost of the key lock and requires the operator to keep track of multiple keys. Another approach is to use an access or cover door on either the entire cabinet or that section which houses the disk drives and then lock the access door. However, the access door is costly and awkward to use. Accordingly, there is a need for a simple, compact and cost effective locking device for securing multiple hard drives carriers within a housing structure.

SUMMARY OF THE INVENTION

It has been discovered that providing a mounting rail with a retaining pin aperture advantageously increases the stability and aids in the alignment of a locking device for the computer system carrier housing.

In one aspect, the present invention includes a mounting rail. The mounting rail includes a guide rail for engaging a carrier to slide the carrier into a secured position in a carrier bay when the guide rail is mounted to a frame defining the carrier bay. The mounting rail defines an aperture for receiving a retaining pin for securing the carrier in the carrier bay.

In another aspect, the present invention includes a computer system. The computer system includes a system processor and a carrier bay frame defining a carrier bay for removably storing a carrier. The carrier includes a peripheral device to be electrically coupled to the system processor. The computer system also includes a mounting rail attached to the carrier frame. The mounting rail includes a guide rail for engaging a carrier to be secured in the carrier bay. The computer system further includes a retaining device. The retaining device includes a retaining pin that is movable to secure a carrier in the carrier bay. The mounting rail defines an aperture. The carrier pin extends through the aperture to retain a surface of the carrier when the carrier is secured in the carrier bay.

In another aspect, the present invention includes a carrier housing. The carrier housing includes a carrier bay frame defining a carrier bay for removably storing a carrier. The carrier housing also includes a mounting rail attached to the carrier frame. The mounting rail includes a guide rail for engaging a carrier to be secured in the carrier bay. The carrier housing further includes a retaining device. The retaining device includes a retaining pin that is movable to secure a carrier in the carrier bay. The mounting rail defines an aperture. The carrier pin extends through the aperture to retain a surface of the carrier when the carrier is secured in the carrier bay.

BRIEF DESCRIPTION OF THE DRAWINGS

The present invention may be better understood, and its numerous objects, features, and advantages made apparent to those skilled in the art by referencing the accompanying drawings.

FIG. 5A AND 5B are partial cross section views taken along line 5—5 of FIG. 3 illustrating the locking bar assembly in the locked position (FIG. 5A) and the unlocked position (FIG. 5B).

The use of the same reference symbols in different drawings indicates similar or identical items.

DESCRIPTION OF THE PREFERRED EMBODIMENT(S)

Figure 1:
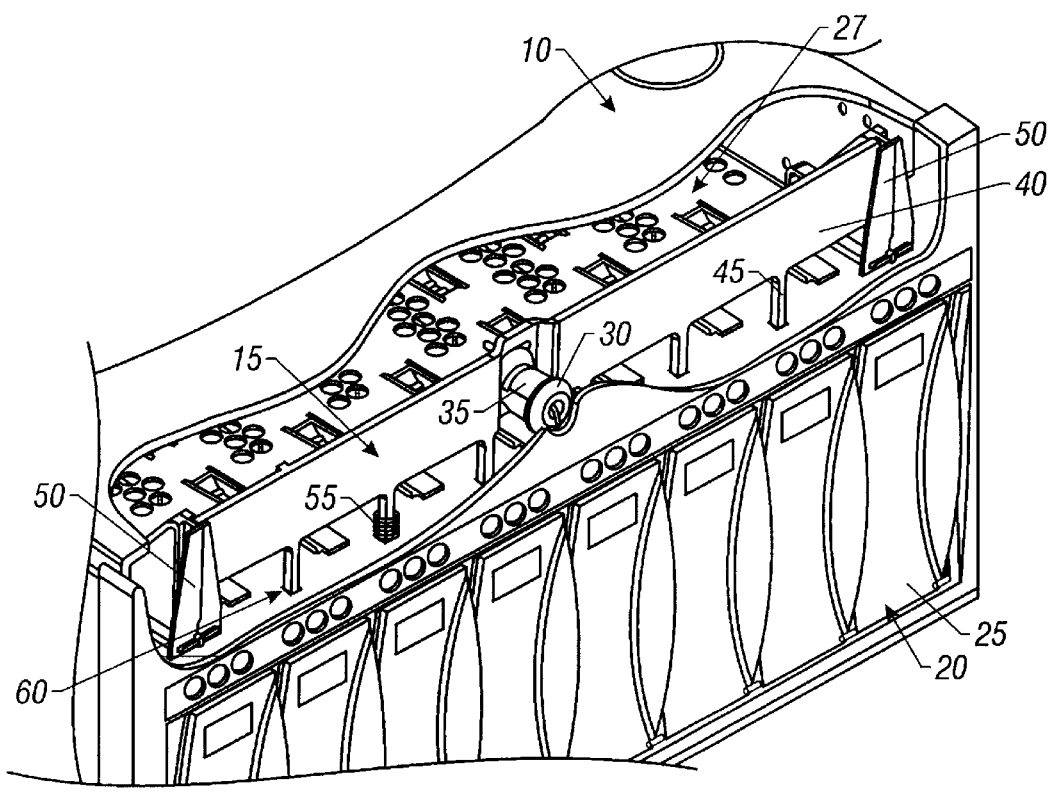
FIG. 1 is a partial perspective view, cut away for clarity, of a disk drive storage cabinet including a locking device in accordance with a first embodiment of the present invention.

In the description which follows, the drawing figures are not necessarily to scale and like parts are marked throughout the specification and drawings with the same reference numerals, respectively.

Referring now to FIG. 1, illustrated is a partial perspective view, cut away for clarity, of a disk drive housing 10 or storage cabinet which incorporates a moveable locking bar assembly 15 in accordance with a first embodiment of the present invention. The disk drive housing 10 includes a frame 27 with at least two disk drive carrier bays 20 in a disk drive carrier opening for housing associated disk drive carriers 25. Disk drive housing 10 is, for instance, a hard drive array storage unit or other conventional structure for computer systems or subsystems having multiple hard disk drives. The locking device of the present invention secures the disk drive carriers 25 into the disk drive carrier bays 20 and includes a locking bar assembly 15 with a key lock assembly 30 and a cam mechanism 35 for positioning the locking bar assembly 15 in either a locked or an unlocked position.

The moveable locking bar assembly 15 is located inside the disk drive housing 10 and spans the disk drive carrier bays 20 and includes a locking bar 40 and at least two locking pins 45 projecting from the locking bar 40, one locking pin 45 for each of the disk drive carriers 25. The locking bar 40 is moveable to either the locked or the unlocked position (illustrated and further described in FIGS. 5A–5B). A cam mechanism 35 is positioned for engaging and camming the locking bar assembly 15 so as to move the locking bar assembly 15 to either the locked position or the unlocked position. A single key lock assembly 30, such as a standard mechanical key lock, is attached to the disk drive housing 10 and is accessible from the exterior of the disk drive housing 10, and is used for actuating the cam mechanism 35. The key lock assembly 30 is worked in a standard manner such as inserting a key and rotating the lock to actuate the cam mechanism 35. The locking pins 45 are, for example, disposed in front of the disk drive carriers 25 when the locking bar assembly 15 is in the locked position (not illustrated) or, preferably, each disk drive carrier 25 includes a slot 60 (further illustrated in FIGS. 5A–5B) wherein, when said locking bar assembly 15 is in the locked position, the locking pins 45 engage the slots 60 of the corresponding disk drive carriers 25 securing the disk drive carriers 25 into the disk drive carrier bays 20.

Also illustrated are two guides 50, one guide 50 located at each end of the locking bar 40 and each guide 50 having a channel therein. Each end of the locking bar 40 is slideably disposed within the corresponding channel and the guides 50 maintain the locking bar assembly 15 in positional alignment during movement to either the locked or the unlocked position. Two or more resilient members 55, such as springs, are disposed on two or more of the locking pins 45 and are used for facilitating movement of the locking bar assembly 15 and preventing the locking bar assembly 15 from binding during movement to either the locked or the unlocked position.

Figure 1A:
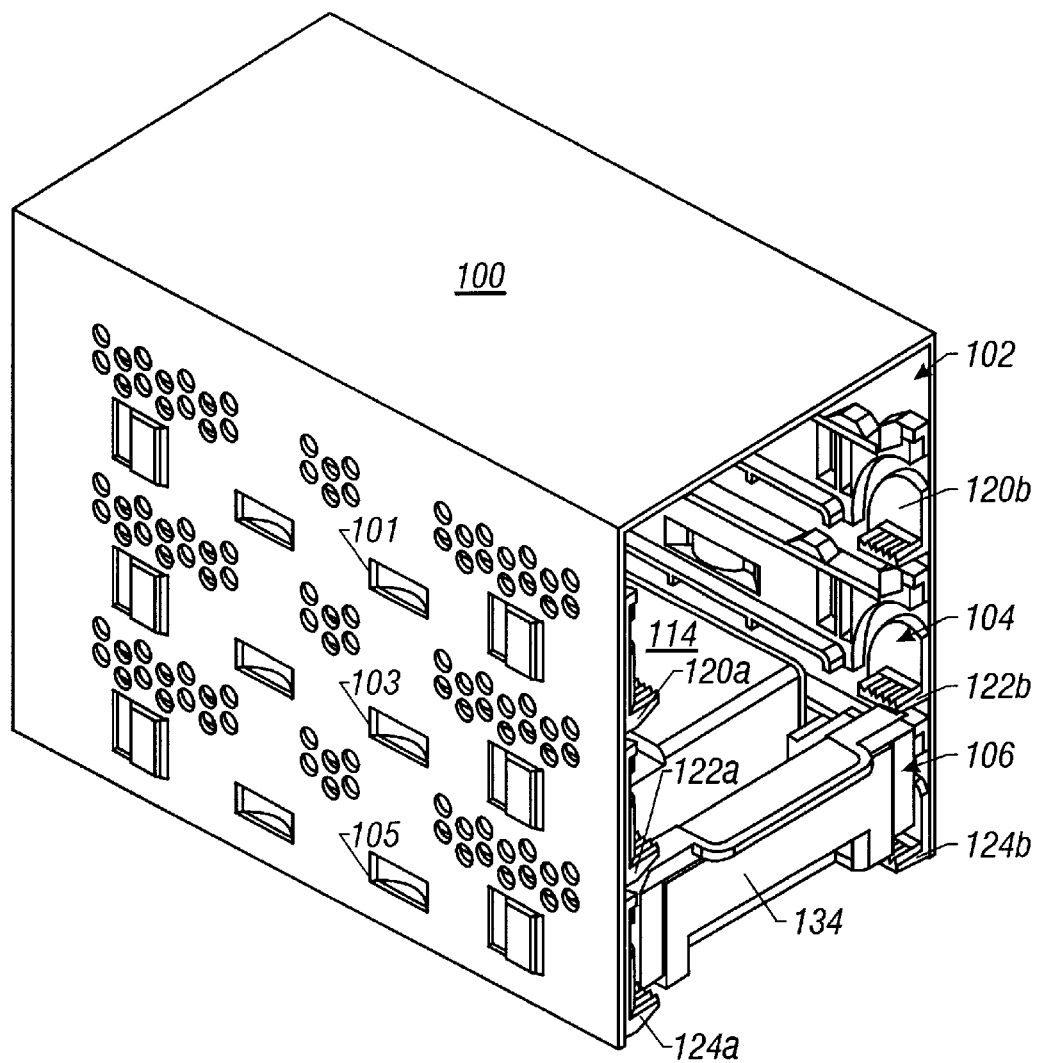
FIGS. 1A, 1B, and 1C are perspective views of embodiments of carrier frames according to the present invention.

FIG. 1A is an isometric view of a carrier bay frame, generally designated 100 containing a plurality of bays 102, 104, 106, each of which bays 102, 104, 106 incorporates the carrier-based mounting structure of the present invention. Only the bay 106 is actually shown as containing a hard disk drive chassis 114.

Each bay 102, 104, 106 has mounted therein a pair of mounting rails or stationary mounts 120a, 120b, 122a, 122b, 124a, 124b. The mounting rails 120a, 120b cooperate to provide a guide path within the bay 102 for a chassis carrier or carrier (not shown). Likewise, the mounting rails 122a, 122b and the mounting rails 124a, 124b cooperate to provide guide paths in the bays 104, 106, respectively, for other carriers, including a chassis carrier 134 shown in a mounted position within the bay 106 and cradling the hard disk drive chassis 114. One example of a carrier is found in U.S. Pat. No. 5,652,695 entitled "Hard Drive Carrier Design Permitting Floating Retention of a Connector Assembly to Facilitate Blind Mounting of the Computer Assembly" which is hereby incorporated by reference in its entirety.

Figure 1B:
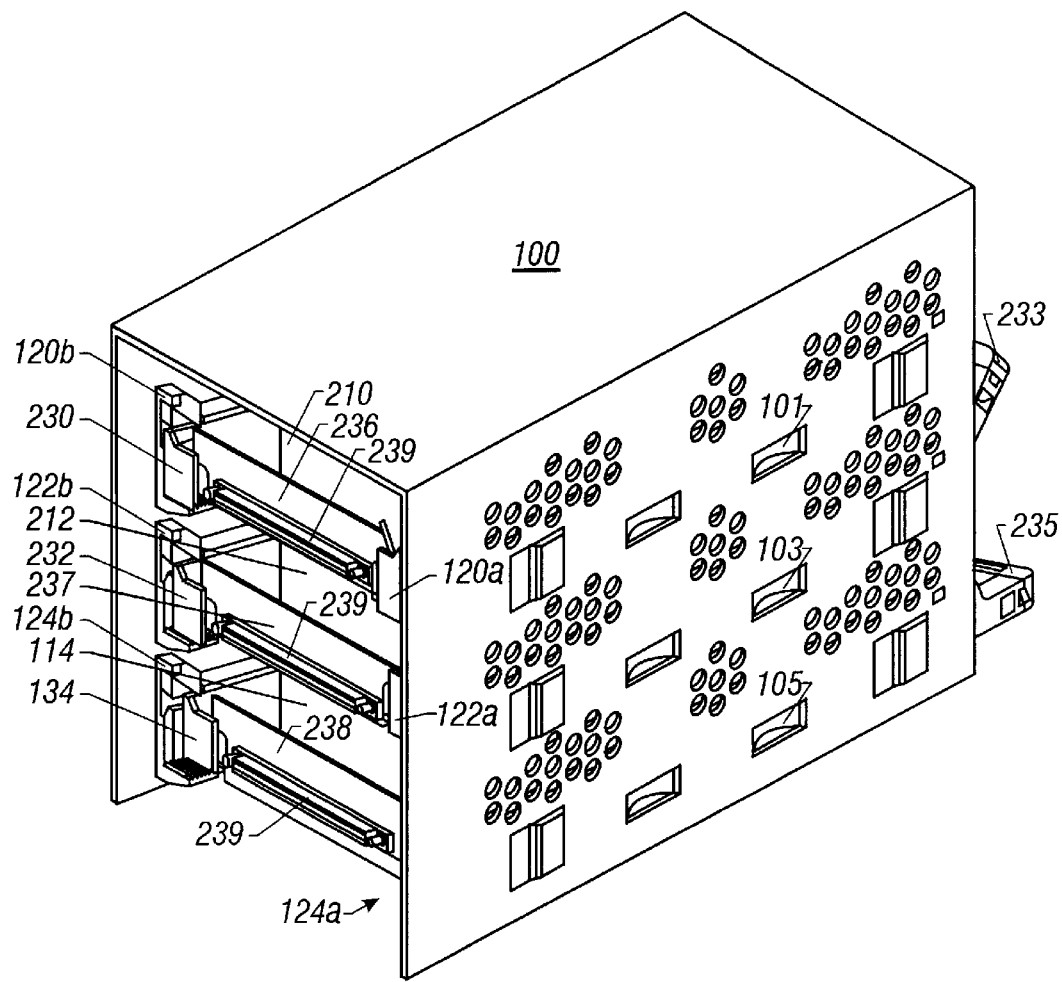

Turning now to FIG. 1B, illustrated is a reverse-angle isometric view of the frame 100 of FIG. 1A wherein the bays 102, 104, 106 contain a plurality of hard disk drives 210, 212, 114 cradled within corresponding chassis carriers 230, 232, 134. The chassis carriers 230, 232, 134 are shown in three successive positions with respect to the frame: the chassis carrier 230 is shown in a mounted or secured position, the chassis carrier 232 is shown in an intermediate position and the chassis carrier 134 is shown in an insertion position. Rotatable mounting handles 233, 235 associated with the chassis carriers 232, 134, respectively, assume particular orientations as a function of the chassis carrier 232, 134 position. A mounting handle associated with the chassis carrier 230 is hidden in FIG. 2. An example of a particular system is disclosed in U.S. Pat. No. 5,668,696 entitled "Carrier-Based Mounting Structure For Computer Peripheral Chassis," which is hereby incorporated by reference by its entirety.

Circuit boards 236, 237, 238 are associated with each of the chassis carriers 230, 232, 134. Certain types of chassis, for instance those containing hard disk drives for computer systems, have circuit boards associated therewith that contain interface hardware and electrical connectors 239 allowing communication of data between the hard disk drive and the computer system including the computer system microprocessor. The illustrated embodiment makes provision for the associated circuit boards 236, 237, 238 on the chassis carriers 230, 232, 134 and further provides an electrical ground for each of the circuit boards 236, 237, 238. Lances 101, 103, 105 associated with the bays 102, 104, 106 effect this electrical ground. However, in other embodiments, the lances may be split lances. For example, see patent application entitled "Computer Peripheral Chassis Frame Structure Having a Split Lance for Location, Electrical Grounding, and Load Bearing of Chassis Carriers" with Ty R. Schmitt and Arthur Lopez listed as inventors, filed concurrently with this application.

Figure 1C:
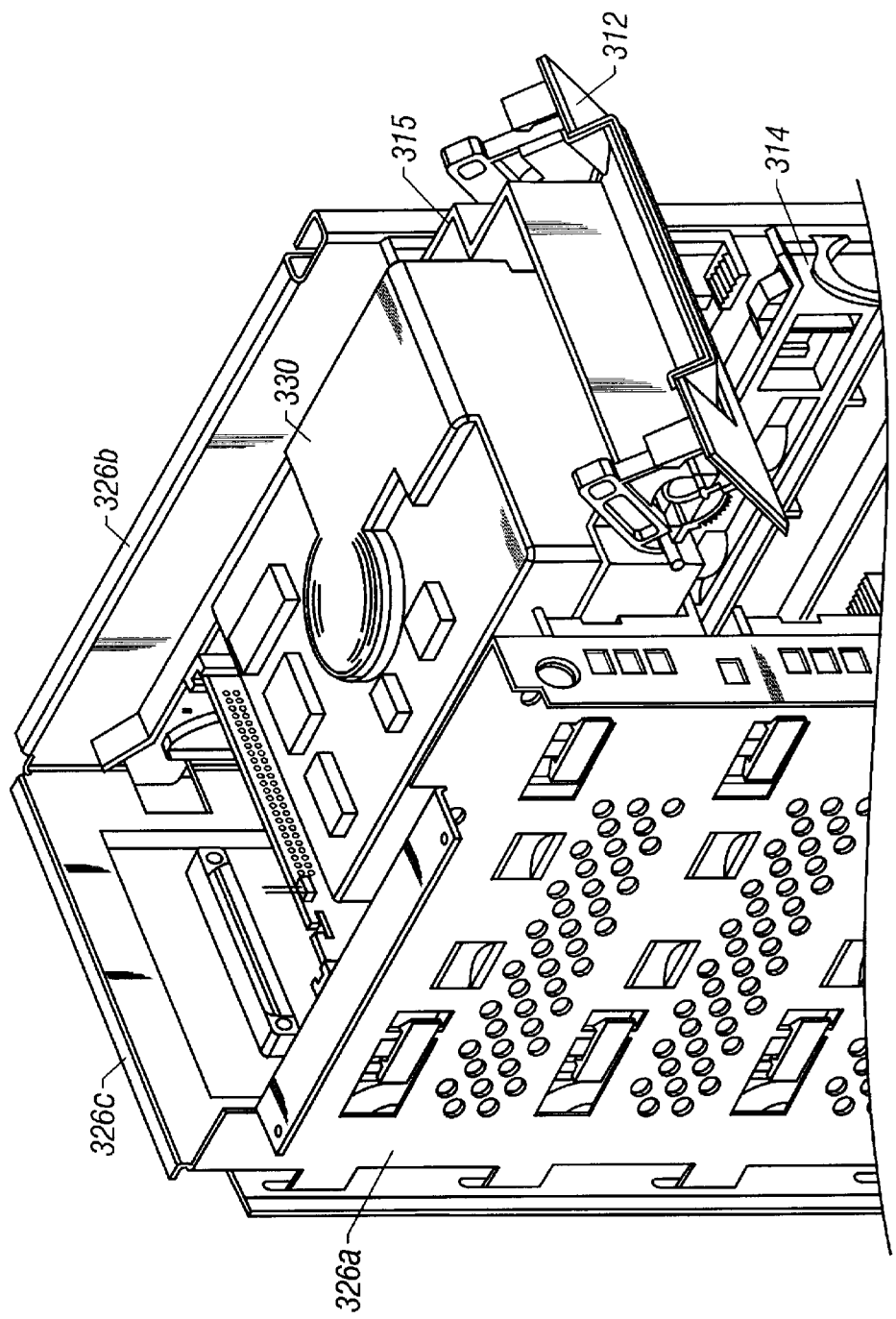

FIG. 1C is a perspective view of the computer device carrier and bay filler panel combination installed in a computer chassis or frame 326. The computer frame 326 includes two sides 326a, 326b and back 326c. As shown, a pair of mounting rails 314 are secured opposite each other, one to each side 326a, 326b, within the frame 326 to form a bay. A door/filler 312, with or without a carrier 315, is then attached to the mounting rails 314 as described above, such that the door/filler 312 seals the bay opening in the chassis 326 when the door/filler 312 is closed. An example of such a system is found in U.S. Pat. No. 5,586,003 entitled "Carrier Device Door and Bay Filler Panel Combination Including Gear and Guide Pin" which is hereby incorporated by reference in its entirety. Not shown in FIGS. 1A, 1B, 1C are the locking devices used to lock or secure the chassis carriers in the carrier bays.

Figure 2:
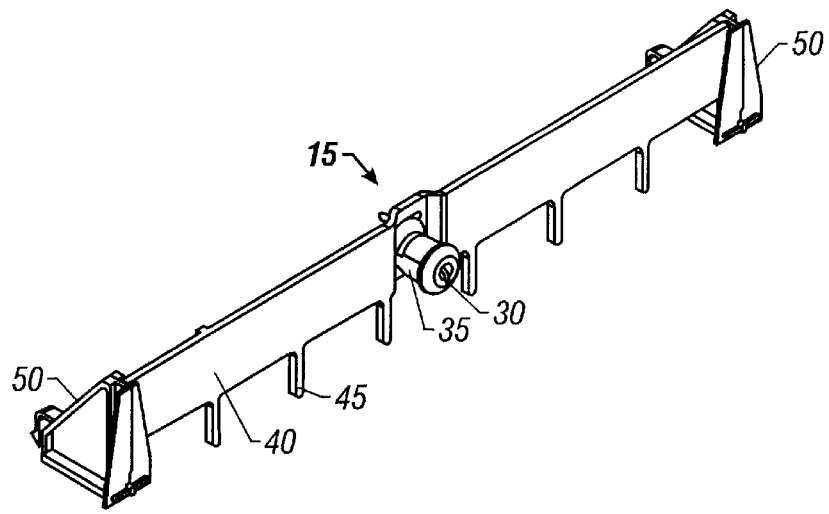
FIG. 2 is a perspective view of the locking bar assembly and guides of the FIG. 1.

A perspective view of the locking bar assembly 15, the cam mechanism 35, the key lock assembly 30 and the guides 50 are illustrated in FIG. 2. As illustrated in both FIG. 1 and FIG. 2, in this first embodiment of the present invention, the locking bar 40 is a substantially flat, rectangular-shaped bar and the locking pins 45 are planar with the locking bar 40. The locking bar assembly 15 is, for example, plastic molded together which provides for a very cost effective locking device. The locking bar assembly 15 may, however, also be manufactured of a metal such as steel.

Figure 3:
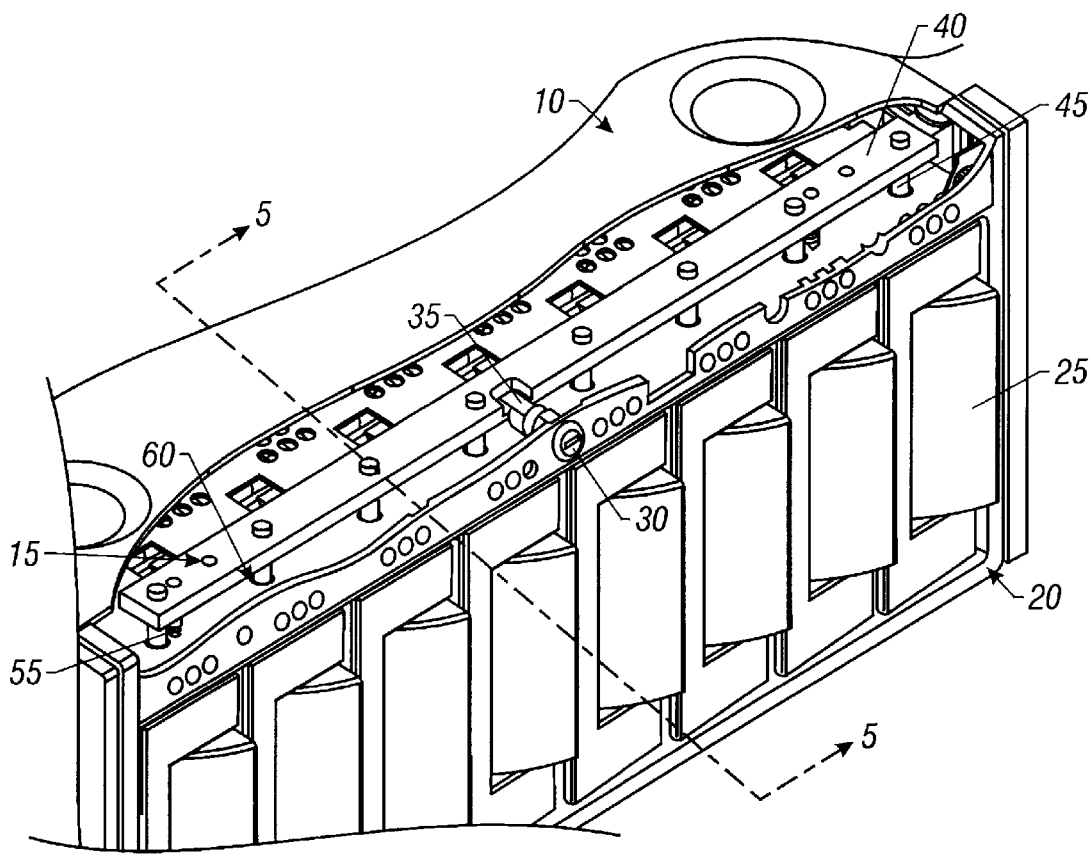
FIG. 3 is a partial perspective view, cut away for clarity, of a disk drive storage cabinet including a locking device in accordance with a second embodiment of the present invention.
Figure 4:
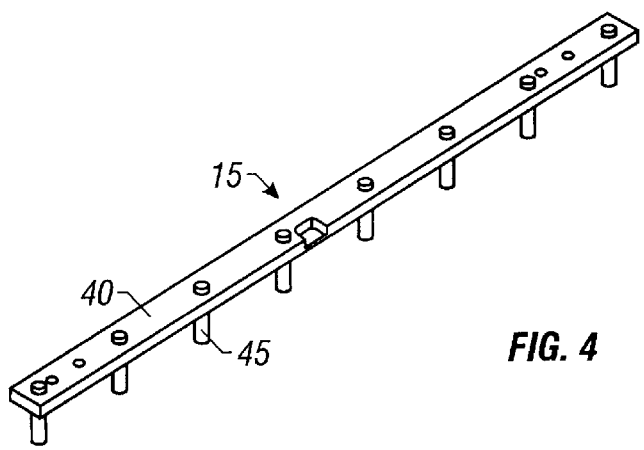
FIG. 4 is a perspective view of the locking bar assembly of the FIG. 3.

FIG. 3 and FIG. 4 illustrate a second embodiment of the locking device of the present invention wherein the locking bar 40 is a substantially flat, rectangular-shaped bar and the locking pins 45 project perpendicular of the locking bar 40. FIG. 3 shows a partial perspective view, cutaway for clarity, of the disk drive housing 10 including the locking bar assembly 15 and the frame 27 with at least two disk drive carrier bays 20 in a disk drive carrier opening for housing the associated disk drive carriers 25. The locking device includes the locking bar assembly 15 with the key lock assembly 30 and the cam mechanism 35 for positioning the locking bar assembly 15 in either the locked or the unlocked position. FIG. 4 shows a perspective view of the locking bar assembly 15 including the locking bar 40 and the locking pins 45.

Referring again to FIG. 3, the moveable locking bar assembly 15 is located inside the disk drive housing 10 and spans the disk drive carrier bays 20 and includes the locking bar 40 and at least two locking pins 45 projecting from the locking bar 40, one locking pin 45 for each of the disk drive carriers 25. The locking bar 40 is moveable to either the locked or the unlocked position (illustrated and further described in FIGS. 5A–5B). The cam mechanism 35 is positioned for engaging and camming the locking bar assembly 15 so as to move the locking bar assembly 15 to either the locked position or the unlocked position. The cam mechanism 35 is, for instance, an integral part of the key lock assembly 30 and is coupled to the locking bar 40 for engaging and movement. The single key lock assembly 30 is used for actuating the cam mechanism 35. The locking pins 45 are, for example, disposed in front of the disk drive carriers 25 when the locking bar assembly 15 is in the locked position (not illustrated) or, preferably, each disk drive carrier 25 includes a slot 60 (further illustrated in FIGS. 5A–5B) wherein, when said locking bar assembly 15 is in the locked position, the locking pins 45 engage the slots 60 of the corresponding disk drive carriers 25 securing the disk drive carriers 25 into the disk drive carrier bays 20.

The locking device of the second embodiment is illustrated without the guides, however, the guides may be used in this embodiment also for maintaining the locking bar assembly 15 in positional alignment during movement to either the locked or the unlocked position. Two or more resilient members 55, such as springs, are used for facilitating movement of the locking bar assembly 15 and preventing the locking bar assembly 15 from binding during movement to either the locked or the unlocked position.

FIGS. 5A and 5B are partial cross section views taken along line 5—5 of FIG. 3 illustrating the second embodiment of the locking device of the present invention in the locked position (FIG. 5A) and the unlocked position (FIG. 5B). FIG. 5A illustrates the locking bar assembly 15 located inside the disk drive housing 10 and in the locked position wherein the locking pin 45 engages the slot 60 in the corresponding disk drive carrier 25 securing the disk drive carrier 25 into the disk drive carrier bay 20. The single key lock assembly 30, accessible from the exterior of the disk drive housing 10, actuates the cam mechanism 35 to position the locking bar assembly 15 in the locked or the unlocked position. The key lock assembly 30 is, for example, attached to the disk drive housing 10 or cabinet and to the frame 27 for the disk drive carrier openings 20. While the figures illustrate a separate frame for the disk drive carrier openings, the disk drive housing or cabinet itself may be used as the frame for the disk drive carrier opening and disk drive carrier bays.

In FIG. 5B, the locking bar assembly 15 is illustrated in the unlocked position wherein the locking bar 40 has been moved such that the locking pin 45 no longer engages the slot 60 of the disk drive carrier 25 and the disk drive carrier 25 is no longer secured within the disk drive carrier bay 20 and is removable from the disk drive housing 10. FIG. 5B shows the disk drive carrier 25 as partially removed from the disk drive carrier bay 20 to more clearly illustrate the unlocked position. The locking bar assembly 15 is, for example, moved towards the disk drive carrier 25 into the locked position to engage the locking pin 45 into the slot 60 in the disk drive carrier 25 and then moved away from the disk drive carrier 25 to the unlocked position to disengage the locking pin 45.

Figure 6:
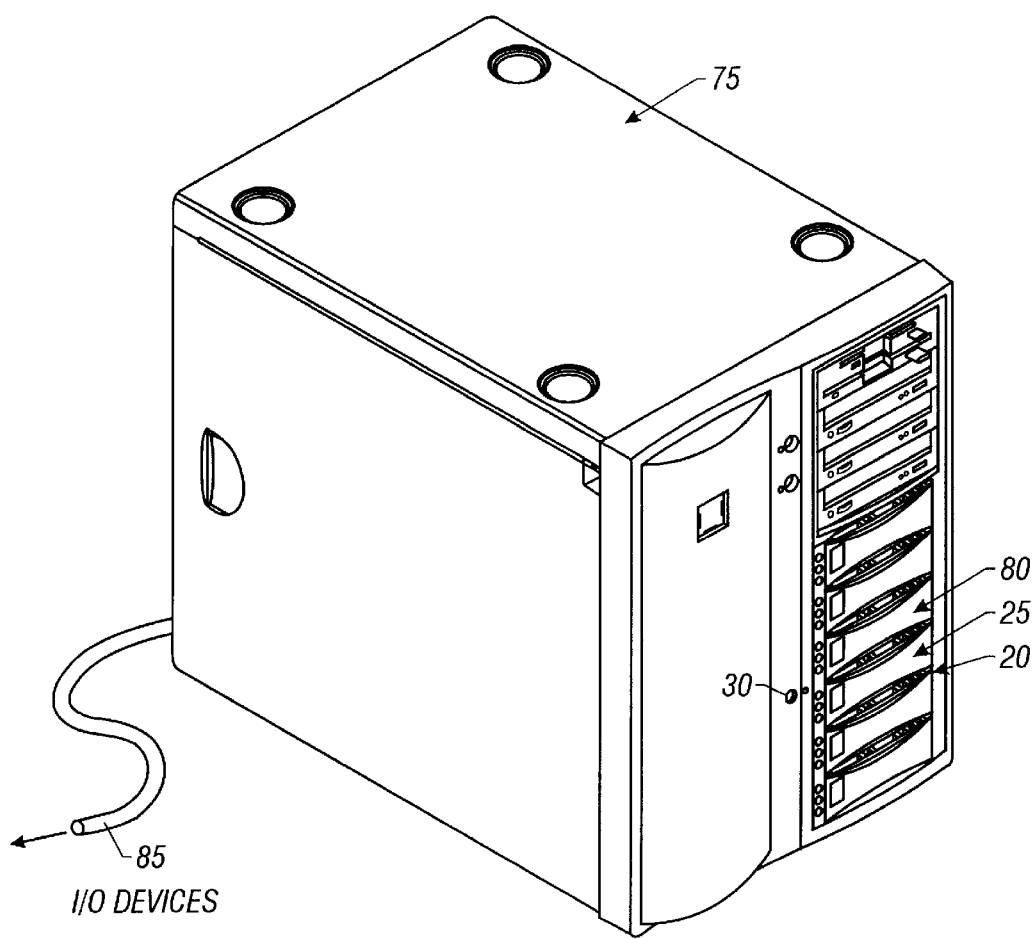
FIG. 6 is a perspective view of a computer system incorporating the locking device of the present invention and illustrating the single key lock feature.

FIG. 6 is a perspective view illustrating a computer system including a central computer or server 75 with a hard drive array unit 80 incorporating the locking device of the present invention and including input and output devices 85 (not illustrated). The server 75 with the hard drive array unit 80 illustrates the disk drive carriers 25 and the disk drive carrier bays 20 and illustrates the single key lock assembly 30 feature of the locking bar assembly which is located inside the disk drive housing, which, in this illustration, is the server cabinet.

Figure 7A:
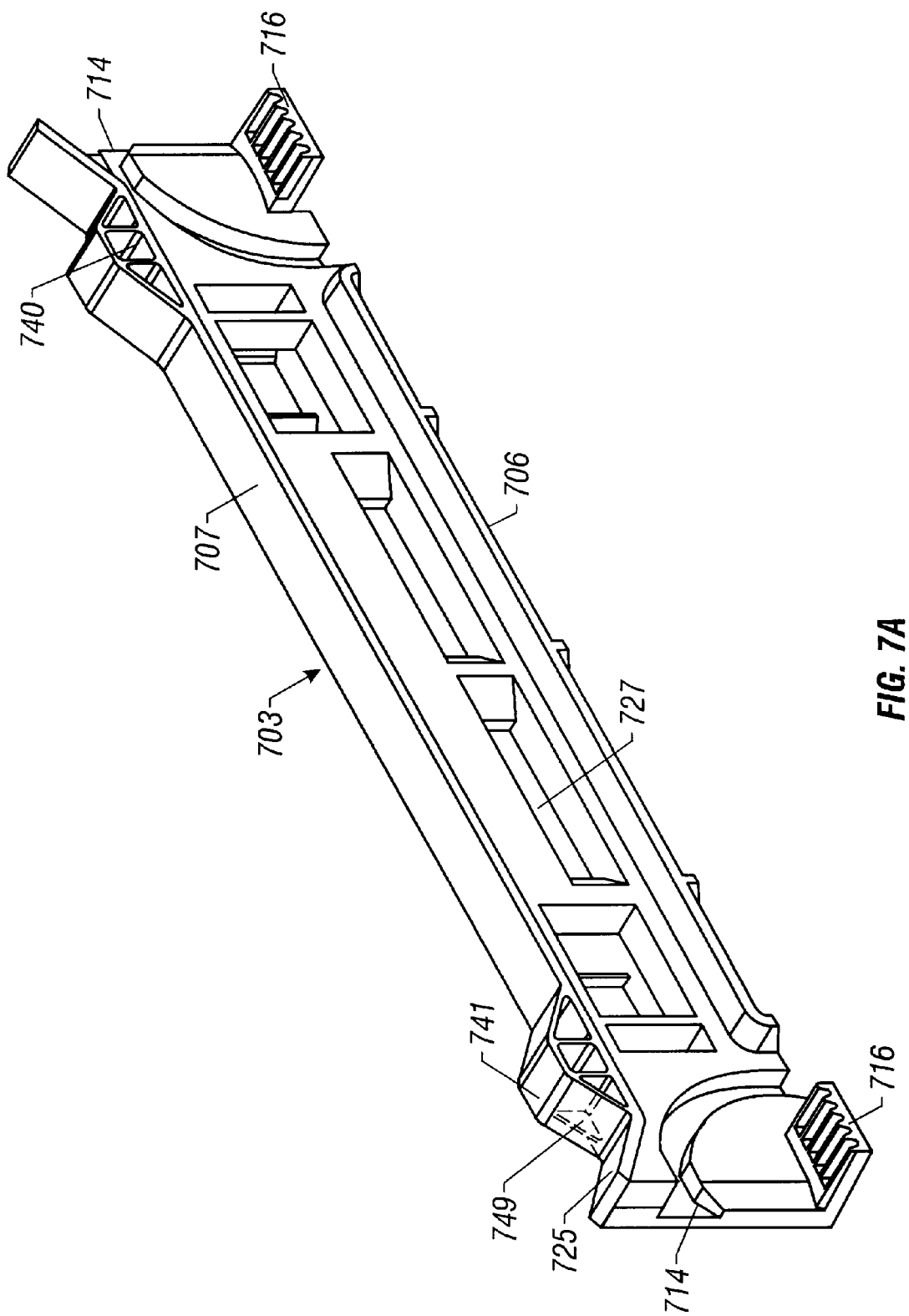
FIG. 7A is a perspective view of one embodiment of a mounting rail according to the present invention.
Figure 7B:
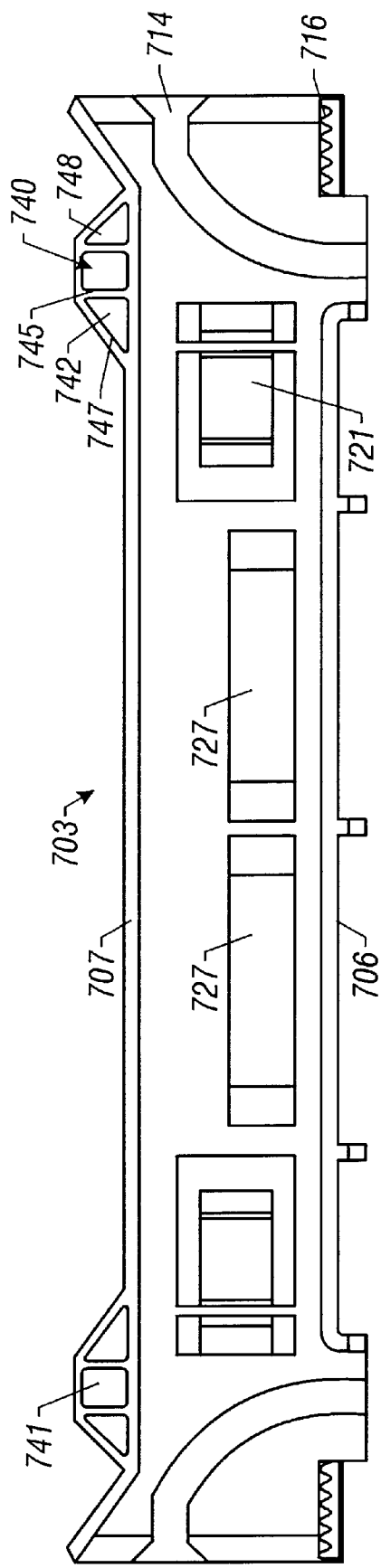
FIG. 7B is a side view of one embodiment of a mounting rail according to the present invention.

Referring to FIGS. 7A and 7B, FIG. 7A shows a perspective view of a mounting rail 703 (also referred to as a stationary mount) and FIG. 7B shows a side view of the mounting rail. Mounting rail 703 includes two guide rails, a top guide rail 707 and a bottom guide rail 706. These guide rails engage a carrier to enable the carrier to be slid into a carrier bay to a secured position where the carrier can be locked into the carrier bay with a securing or locking device. The mounting rail has an elongated form with the guide rails running generally along the elongation. In some embodiments, the carrier includes corresponding guide rails which engage guide rails 707 and 706. Guide rails 706 and 707 provide support and stability to the carrier as the carrier is being slid into a secured or locked position and when the carrier is housed in the secured position. In the embodiment shown, the upper guide rail widens out at the ends of the mounting rail. This widening eases the initial alignment of the carrier when the carrier is first inserted into the carrier bay.

In the embodiment shown, mounting rail 703 includes cam slots 714 and rack gears 716 that a enable the mounting rail to be implemented with a carrier utilizing a pivotally attached handle or door handle with cam followers and pinion gears. Such a system is disclosed in U.S. Pat. No. 5,668,696. The mounting rail 703 also includes cantilevered attaching clips 721 for removably attaching the mounting rail to a carrier bay frame. The mounting rail also includes through holes 727 for allowing lances to pass there through to contact resilient contacts for grounding purposes.

In the embodiment shown, mounting rail 703 is vertically symmetric to allow the mounting rail to be operablely mounted on either the right side or left side of a carrier bay.

In the embodiment shown, mounting rail 703 includes apertures 740 and 741 for receiving a retaining pin or locking pin used to secure or lock a carrier to a carrier bay. When the mounting rail is mounted in the carrier bay, a retaining pin is received by the aperture (740 or 741) located on the end of the mounting rail that resides at the front of the carrier bay (See FIG. 8A).

In the embodiment shown aperture 740 is formed by an aperture frame 745 located above the upper guide rail 707 on top of the mounting rail. Connected to each side of the aperture frame 745 are stiffening ribs 747 and 748. These ribs provide structural support to the aperture frame 745 especially in resistance to forces applied to the side walls of the aperture frame. In the embodiment shown, stiffening ribs 747 and 748 have a filled member 749 to provide structural support as shown in phantom on the stiffening rib for aperture 741 on FIG. 7A.

In the embodiment shown, the aperture frame 745 and stiffening ribs 747 and 748 are integrally formed with mounting rail. However, in other embodiments, the aperture frame may be made separately and attached later in the manufacturing process.

In other embodiments, the aperture for the retaining pin may be located on or in other parts of the mounting rail.

In the embodiment shown, the retaining pin apertures have a rectangular shape to match the cross section of the retaining pin, which, for the embodiment shown, is rectangular. However, in other embodiments, the aperture may have other shapes such as a circle shape. Having the retaining pin aperture match the cross-section of the retaining pin enables the aperture to provide stability to the retaining pin in the directions generally perpendicular to the axis of the retaining pin.

Figure 8B:
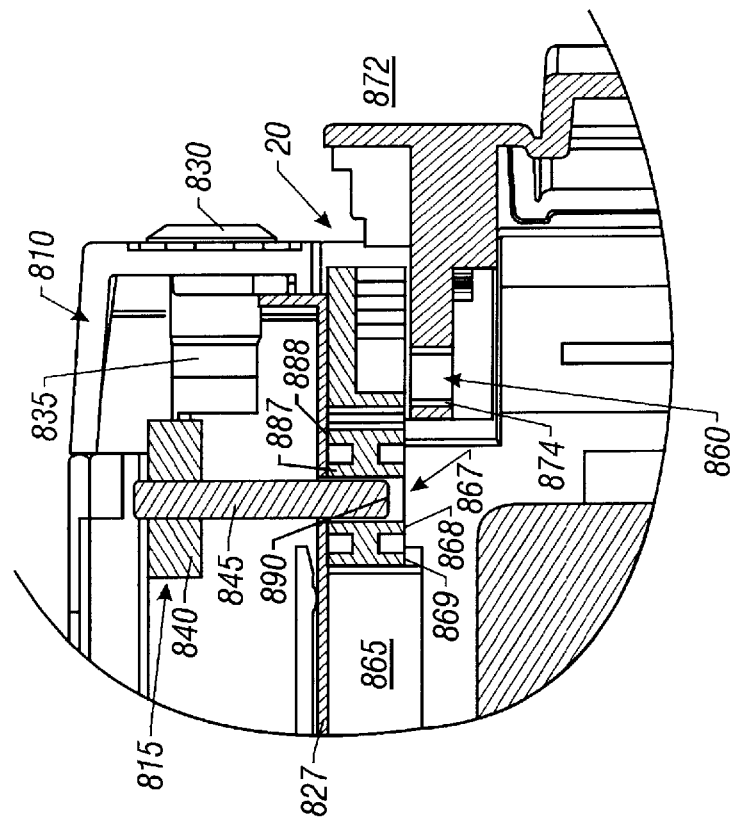
FIG. 8B is a partial cross sectional view of one embodiment of a retaining pin in an unsecured position with respect to the carrier according to the present invention.
Figure 8A:
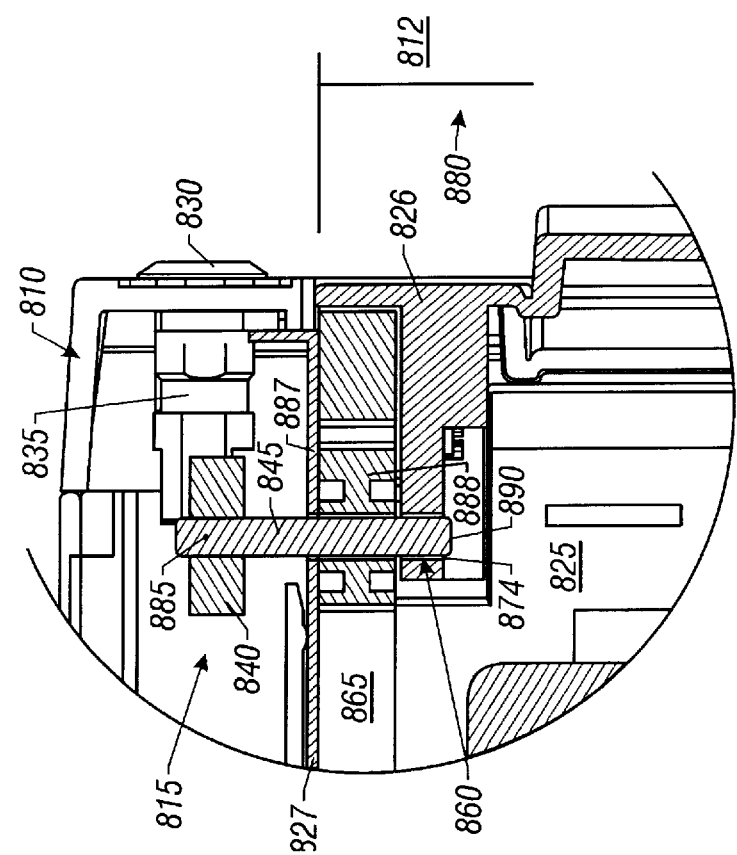
FIG. 8A is a partial cross sectional view of one embodiment of a retaining pin in a secured position to secure a carrier according to the present invention.

FIGS. 8A and 8B show partial cross sectional top views of a carrier in a carrier bay. Retaining pin or locking pin 845 is shown in FIG. 8A in a secured positioned and in FIG. 8B in an unsecured position. In the embodiment shown, the retaining pin 845 is part of a key actuated locking device 815 that enables a user to lock the carrier in a locked or secured position. The locking device includes a locking or retaining bar 840 attached to the retaining pin 845. The retaining or locking bar 840 is moved towards and away from the carrier (downwards and upwards, respectively, relative to the views shown in FIGS. 8A and 8B) to lock and unlock the carrier by a cam mechanism 835 that is actuated by a key (not shown) via a key lock assembly 830. The key lock assembly is accessible to the user from outside the disk drive housing 810. In other embodiments, several locking pins are connected or attached to the locking bar 840 to secure or lock a number of carriers to a bay with the key actuated locking device 815. Also in other embodiments, the locking bar of FIG. 2 may be used in the locking device of FIGS. 8A and 8B.

Carrier 825 includes a hard disk drive (not shown). Carrier 825 is shown in a secured positioned (FIG. 8A) and in an unsecured position (FIG. 8B) where the carrier 825 extends slightly out from the secured position through the opening 812 of the carrier bay.

FIG. 8A and FIG. 8B also show a mounting rail 865 (similar to that of FIGS. 7A and 7B) attached to an interior wall 827 of the carrier bay frame. Retaining pin aperture 867 is surrounded by aperture frame walls 868 and 887. Connected to the aperture frame wall 868 is stiffening rib 869 and connected to aperture frame wall 887 is stiffening rib 888. The mounting rail also includes rack gears 872.

In the embodiment shown, the carrier 825 includes a pivotally mounted door/handle 826 that is pivotable with respect to the carrier to aid in the insertion and removal of the carrier from the bay. Fixablely coupled to the door/handle is a door retaining pin aperture 860 or slot. When the carrier 825 is in the secured position (as shown in FIG. 8A) with respect to carrier bay, the handle 826 is in a position where the door pin aperture 860 lines up with the mounting rail retaining pin aperture 867 such that the retaining pin 845 may be moved to a secured or locking position as shown in FIG. 8A to secure the carrier 825 to the bay by providing a retaining force against the side 874 of the carrier retaining pin aperture 860. In other embodiments, the carrier aperture for receiving the retaining pin may be located on other parts of the carrier.

In the secured position as shown in FIG. 8A, retaining pin 845 extends through the mounting rail aperture 867. Having the retaining pin 845 extending through the mounting rail aperture 867 when pin 845 is retaining carrier 825 advantageously provides the disk drive housing 810 with an extra retaining or securing force in the event of an attempted removal of a secured carrier. Referring to FIG. 8A, if a force in the direction of arrow 880 were to be applied to the secured carrier 825 in an attempt to remove carrier 825 from the carrier bay, wall 874 of door aperture 860 would provide a force on pin 845, that unrestrained, would rotate the locking assembly 815 in a counter clockwise direction around point 885 (depending upon how the locking assembly 815 is secured to the housing), relative to the view shown in FIG. 8A. However, because the retaining pin 845 extends through the mounting rail aperture 867, side 887 of the mounting rail aperture frame provides a counter force inward towards the carrier bay to resist the counterclockwise force upon the locking device 815, relative to the view shown in FIG. 8A, as applied by a removal force on the secured carrier. Stiffening rib 888 connected to aperture frame wall 887 supports the frame wall 877 in countering a removal force.

Because the aperture frame 867 and stiffing rib 888 are connected to the main elongated body of the guide rail 865 which is attached to the carrier bay frame 827 at locations inward towards the carrier bay and away from the retaining pin 845, the force against the aperture wall 887 by the removal force applied to retaining pin 845 is spread out to those locations where the mounting rail is attached to the carrier bay frame. Consequently, providing a mounting rail with a retaining pin aperture enables the mounting rail to be utilized as part of the locking structure of the carrier bay in securing a carrier to the carrier bay. In addition to providing additional carrier retention or locking support, utilizing the mounting rails in carrier retention or locking reduces the need to provide extra stiffening structures to the carrier locking system of a carrier bay, thereby decreasing the complexity, cost, and size of a carrier bay system.

Another advantage of the present invention is that the retaining pin aperture of a mounting rail provides a guide for the retaining pin in moving from an unsecured position to the secured position to secure a carrier in a carrier bay. In the embodiment shown, when the retaining pin is in its "farthest back" unsecured position (the farthest that the retaining pin moves towards the top of FIG. 8B when the locking device 815 is in an unlocked position) as shown in FIG. 8B, the end portion 890 of the retaining pin 845 resides within the mounting rail aperture 867. When the cam 835 is actuated by a key to secure or lock the carrier 825 in the carrier bay, the end portion 890 moves through the aperture 867, out of the carrier side of the aperture 867, and into the carrier aperture 860 where the retaining pin 845 provides a retaining force against side wall 874.

Because the retaining pin 845 needs to penetrate the carrier aperture 860 to secure the carrier 825 in the carrier bay, the retaining pin 845 must enter the carrier retaining pin aperture 860 at a particular location with respect to the carrier bay. Having a mounting rail aperture 867 aids in the alignment of the retaining pin 845. Typically, the dimensions of the mounting rail 865 are built within specific tolerances to match a carrier to enable the carrier to be inserted and slid into the bay on the guide rails, and in the embodiment shown, for the gears and cam slot or other interlocking devices of a mounting rail to match the gears and cam follower or other interlocking devices of the carrier door. Thus, the technical feasibility of making the mounting rail aperture 867 line up with the carrier aperture 860 is relatively simple as compared to the feasibility of manufacturing a locking device within tolerances that allow for the alignment of the retaining pin with the carrier aperture when the carrier is moved into the secured position. Thus, having a retaining pin aperture in the mounting rail and having the end portion of the retaining pin residing in the mounting rail aperture when the retaining pin is in an unsecured position enables a locking or retaining device of a carrier housing to have greater or more forgiving tolerances with respect to the carrier.

Referring to FIG. 8A, to unlock or unsecure the carrier from the bay, the user turns a key that actuates the cam mechanism 835 to move the locking bar 840 outwards away from the carrier 825 (upwards relative to the view shown in FIG. 8A) to move the retaining pin 845 out of the carrier aperture 860. To remove the carrier from the bay in the embodiment shown, the handle or door 826 is rotated downward (into the page relative to the view shown in FIG. 8A) to move the carrier 825 outwards through the opening 812 (to the right relative to the view in FIG. 8A).

In some embodiments, the handle or door may interact with the frame or mounting handles such that the handle is required to be rotated with respect to the carrier before the carrier can be removed from the carrier bay. In these embodiments, the mounting rail aperture is positioned to where the retaining pin provides a force that prevents the handle from being rotated, with respect to the carrier, to prevent the carrier from being removed from the bay.

Although in the embodiment shown, the retaining pin is movable by a locking device that is key actuated, in other embodiments the retaining or locking pins may be movable by other user interface devices, such as a knob or screw actuated cam.

While there has been illustrated and described particular embodiments of the present invention, it will be appreciated that numerous changes and modifications will occur to those skilled in the art, and it is intended in the appended claims to cover all those changes and modifications which fall within the true spirit and scope of the present invention.

The present invention provides a simple, compact and cost effective locking device that simultaneously secures one or more hard disk drive carriers or cartridges in a disk drive housing within a confined space and which is operated with a single key lock which allows for reliability and ease of use not previously available. While the disk drive housing described in the figures illustrates a hard drive array unit storage cabinet as part of a computer system, the locking device of the present invention may be used in any central computer system, server or computer subsystem wherein multiple disk drives are to be secured within a cabinet, frame or housing. Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

What is claimed is:

1. A computer system comprising:

a system processor;

a carrier bay frame defining a carrier bay for removably storing a carrier, the carrier including a peripheral device to be electrically coupled to the system processor;

a mounting rail attached to the carrier frame, the mounting rail including a guide rail for engaging a carrier to be secured in the carrier bay;

a retaining device including a retaining pin that is movable to secure a carrier in the carrier bay;

wherein the mounting rail defines an aperture, the retaining pin extends through the aperture to retain a surface of the carrier when the carrier is secured in the carrier bay;

wherein the retaining device is key actuated.

2. The computer system of claim 1 wherein the aperture is located above the guide rail.

3. The computer system of claim 1 wherein the mounting rail has a front end and a back end, the front end located at a front side of the carrier bay, the aperture located towards the front end of the mounting rail.

4. The computer system of claim 1 wherein the aperture is rectangular shaped.

5. The computer system of claim 1 wherein:

the retaining pin has a cross section;

the aperture has a form;

the cross section of the retaining pin matching the form of the aperture.

6. The computer system of claim 1 wherein mounting rail has a generally elongated form, the guide rail running in the general direction of the elongation of the elongated form, the aperture being defined as generally perpendicular to the elongation.

7. The computer system of claim 1 wherein the peripheral is a hard disk drive, the hard disk drive accessible by the processor when the carrier is in the secured position.

8. The computer system of claim 1 wherein the retaining device includes a retaining bar, the retaining pin connected to the retaining bar, the retaining bar being movable by a user from the exterior of the computer system to secure the carrier in the carrier bay.

9. The computer system of claim 1 wherein the carrier bay frame defines a second carrier bay, the computer system further including:

a second mounting rail attached to the carrier frame, the mounting rail including a guide rail for engaging a carrier to be stored in the second carrier bay;

wherein the retaining device includes a second retaining pin that is movable to secure a carrier in the second carrier bay;

wherein the second mounting rail defines a second aperture, the second retaining pin extends through the aperture to retain a surface of the carrier when the carrier is secured in the second carrier bay.

10. The computer system of claim 1 wherein the carrier includes a pivotally attached door, the retained surface of the carrier is located on the pivotally attached door.

11. The computer system of claim 1 wherein the mounting rail is removably attached to the carrier bay frame.

12. The computer system of claim 1 wherein:

the retaining pin has an end portion;

when the retaining pin is in an unsecured position, the end of the retaining pin resides within the aperture;

when the retaining pin is moved to secure the carrier, the end of the pin moves from its position when the retaining pin is in an unsecured position, through the remaining portion of the aperture and out of a side of the aperture adjacent to the carrier.

13. The computer system of claim 1 wherein:

the retaining pin is movable by the retaining device between a secured position wherein the retaining pin secures a carrier in the carrier bay and an unsecured position wherein when the retaining pin is not securing the carrier;

the unsecured position of the retaining pin is the farthest away position of the retaining pin from the secured position that the retaining device can move the retaining pin;

the retaining pin has an end portion;

when the retaining pin is in the unsecured position, the end of the retaining pin resides within the aperture.

14. The computer system of claim 1 wherein the mounting rail is operably mountable on two opposite sides of the carrier bay.

15. The computer system of claim 14 wherein:

the mounting rail further defines a second aperture, wherein when the mounting rail is mounted on a first opposite side of the carrier bay, the aperture receiving the retaining pin to secure the carrier in the bay;

when the mounting rail is mounted on a second opposite side of the carrier bay, the second aperture receiving the retaining pin to secure the carrier in the bay.

16. The computer system of claim 1 wherein the mounting rail further comprises:

a second guide rail located above the guide rail, the second guide rail and the guide rail run in a generally parallel direction along the mounting rail, at an end portion of the mounting rail, the second guide rail widens out, the widening out of the second guide rail at the end portion eases the insertion of a portion of the carrier in the bay between the guide rails during the insertion of the carrier into the carrier bay;

wherein the aperture is defined as being located in the mounting rail interior to the end portion.

17. The computer system of claim 1 further comprising:

a second mounting rail attached to the carrier frame on an opposite side of the carrier bay from the mounting rail, the second mounting rail including a guide rail for engaging the carrier.

18. A computer system comprising:

a system processor;

a carrier bay frame defining a carrier bay for removably storing a carrier, the carrier including a peripheral device to be electrically coupled to the system processor;

a mounting rail attached to the carrier frame, the mounting rail including a guide rail for engaging a carrier to be secured in the carrier bay;

a retaining device including a retaining pin that is movable to secure a carrier in the carrier bay;

an aperture frame, the aperture frame attached to the mounting rail, the aperture frame defining the aperture;

wherein the retaining pin extends through the aperture to retain a surface of the carrier when the carrier is secured in the carrier bay.

19. The computer system of claim 18 further comprising:

a stiffening rib attached to the aperture frame and the a portion of the mounting rail adjacent to the aperture frame, the stiffening rib providing structural support for the aperture frame with respect to the mounting rail.

20. The computer system of claim 18 wherein the retaining device is key actuated.

21. The computer system of claim 18 wherein the aperture frame is integrally formed with the mounting rail.

22. A computer system comprising:

a system processor;

a carrier bay frame defining a carrier bay for removably storing a carrier, the carrier including a peripheral device to be electrically coupled to the system processor, wherein the carrier bay frame defines a second carrier bay;

a mounting rail attached to the carrier frame, the mounting rail including a guide rail for engaging a carrier to be secured in the carrier bay;

a retaining device including a retaining pin that is movable to secure a carrier in the carrier bay;

a second mounting rail attached to the carrier frame, the mounting rail including a guide rail for engaging a carrier to be stored in the second carrier bay;

wherein the retaining device includes a second retaining pin that is movable to secure a carrier in the second carrier bay;

wherein the mounting rail defines an aperture, the retaining pin extends through the aperture to retain a surface of the carrier when the carrier is secured in the carrier bay;

wherein the second mounting rail defines a second aperture, the second retaining pin extends through the aperture to retain a surface of the carrier when the carrier is secured in the second carrier bay;

wherein the retaining device includes a retaining bar, the first and second retaining pins connected to the retaining bar, the retaining bar being movable to a secured position by a user from the exterior of the computer system to move the first retaining pin to retain a surface on a first carrier in a secured position in the first carrier bay and to move a second retaining pin to retain a surface on a second carrier in a secured position in the second carrier bay.

23. The computer system of claim 22 wherein the retaining bar is movable to a secured position by a key actuated cam.

* * * * *

UNITED STATES PATENT AND TRADEMARK OFFICE
CERTIFICATE OF CORRECTION

PATENT NO.    : 6,049,451
ISSUE DATE    : April 11, 2000
INVENTOR(S)   : Schmitt, Ty R.; Lopez, Arthur L.; Sands, Steven L.

It is certified that error appears in the above-identified patent and that said Letters Patent is hereby corrected as shown below:

Column 11; lines 8-10; please delete entire claim 14;.
Column 11, lines 11-18; please delete entire claim 15;
Column 11, lines 19-30; please delete entire claim 16;
Column 11, lines 31-35; please delete entire claim 17; *and*
Column 12, lines 8-9; please delete entire claim 21.

Signed and Sealed this

Twenty-fourth Day of April, 2001

Attest:

NICHOLAS P. GODICI

Attesting Officer    Acting Director of the United States Patent and Trademark Office